(12) United States Patent
Lee et al.

(10) Patent No.: US 8,405,084 B2
(45) Date of Patent: Mar. 26, 2013

(54) ORGANIC LIGHT EMITTING DIODE DISPLAY AND METHOD FOR MANUFACTURING THE SAME

(75) Inventors: Yul-Kyu Lee, Yongin (KR); Chun-Gi You, Yongin (KR); Sun Park, Yongin (KR); Jong-Hyun Park, Yongin (KR); Jin-Hee Kang, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 197 days.

(21) Appl. No.: 12/926,377

(22) Filed: Nov. 15, 2010

(65) Prior Publication Data

US 2011/0114960 A1 May 19, 2011

(30) Foreign Application Priority Data

Nov. 16, 2009 (KR) .......................... 10-2009-0110479

(51) Int. Cl.
*H01L 29/04* (2006.01)

(52) U.S. Cl. .............. 257/59; 257/40; 257/72; 257/79; 257/84; 257/93; 438/22; 438/30; 438/82; 438/99; 438/151

(58) Field of Classification Search .......................... None
See application file for complete search history.

(56) References Cited

U.S. PATENT DOCUMENTS

| 5,296,653 A | 3/1994 | Kiyota et al. |
| 2004/0051821 A1 | 3/2004 | Cheng et al. |
| 2006/0092341 A1 | 5/2006 | Huang et al. |
| 2007/0103061 A1 | 5/2007 | Li |
| 2008/0012008 A1* | 1/2008 | Song et al. ........... 257/40 |

FOREIGN PATENT DOCUMENTS

| JP | 2005-166662 A | 6/2005 |
| JP | 2006-190640 A | 7/2006 |
| JP | 2006-309172 A | 11/2006 |
| JP | 2007-298649 A | 11/2007 |
| JP | 2008-066678 A | 3/2008 |
| KR | 10-0870019 B1 | 3/2004 |
| KR | 10 2005-0049999 A | 5/2005 |
| KR | 10 2006-0000356 A | 1/2006 |
| KR | 10 2007-0102161 A | 10/2007 |

* cited by examiner

Primary Examiner — Kyoung Lee
(74) Attorney, Agent, or Firm — Lee & Morse, P.C.

(57) ABSTRACT

An organic light emitting diode display includes a substrate main body, a polysilicon semiconductor layer on the substrate main body, a gate insulating layer covering the semiconductor layer, and a gate electrode and a pixel electrode on the gate insulating layer, the gate electrode and the pixel electrode each including a transparent conductive layer portion with a gate metal layer portion on the transparent conductive layer portion, and the pixel electrode including a light emitting area having the transparent conductive layer portion and a non-light emitting area having both the transparent conductive layer portion and the gate metal layer portion.

20 Claims, 8 Drawing Sheets

ORGANIC LIGHT EMITTING DIODE DISPLAY AND METHOD FOR MANUFACTURING THE SAME

BACKGROUND

1. Field

Embodiments relate to an organic light emitting diode (OLED) display and a method for manufacturing the same.

2. Description of the Related Art

An organic light emitting diode display is a self emissive display that displays an image using an organic light emitting diode for emitting light. Since, unlike a liquid crystal display, the organic light emitting diode display does not need a separate light source, it can have a relatively small thickness and low weight. In addition, since the organic light emitting diode display exhibits high-quality characteristics such as low power consumption, high luminance, high response speed, etc., it is receiving much attention as a next-generation display device.

SUMMARY

Embodiments are directed to an organic light emitting diode display and a method for manufacturing the same, which substantially overcome one or more problems due to the limitations and disadvantages of the related art.

It is therefore a feature of an embodiment to provide an organic light emitting diode display that has a relatively simple structure.

It is therefore another feature of an embodiment to provide a simplified method for manufacturing an organic light emitting diode display.

At least one of the above and other features and advantages may be realized by providing an organic light emitting diode display, including a substrate main body, a polysilicon semiconductor layer on the substrate main body, a gate insulating layer covering the semiconductor layer, and a gate electrode and a pixel electrode on the gate insulating layer, the gate electrode and the pixel electrode each including a transparent conductive layer portion with a gate metal layer portion on the transparent conductive layer portion, and the pixel electrode including a light emitting area having the transparent conductive layer portion and a non-light emitting area having both the transparent conductive layer portion and the gate metal layer portion.

The gate electrode may be on the semiconductor layer, the transparent conductive layer portion of the gate electrode being between the gate metal layer portion of the gate electrode and the semiconductor layer, and the semiconductor layer may include a channel region, the channel region overlapping with the gate electrode, and source and drain regions on respective sides of the channel region.

The organic light emitting diode display may further include an interlayer insulating layer on the gate electrode and the pixel electrode, the interlayer insulating layer having an opening that at least partially exposes the light emitting area of the pixel electrode, and a source electrode and a drain electrode on the interlayer insulating layer.

The source electrode may be connected to the source region of the semiconductor layer, and the drain electrode may be respectively connected to the drain region of the semiconductor layer and the non-light emitting area of the pixel electrode, the drain electrode contacting the gate metal layer portion of the pixel electrode.

The source electrode, the drain electrode, and the gate metal layer portion of the gate electrode may be formed of a same material.

The organic light emitting diode display may further include a second capacitor electrode having a gate metal layer portion, wherein the source electrode, the drain electrode, the gate metal layer portion of the second capacitor electrode, and the gate metal layer portion of the gate electrode are formed of the same material.

The source electrode, the drain electrode, and the gate metal layer portion of the gate electrode may each be a multi-layer structure that includes a metal layer of copper or aluminum, and a metal layer of molybdenum.

The organic light emitting diode display may further include a first capacitor electrode, the first capacitor electrode having a polysilicon layer on a same layer as the polysilicon semiconductor layer, and a second capacitor electrode on the first capacitor electrode, the second capacitor electrode being on a same layer as the gate electrode.

The second capacitor electrode may have a gate metal layer portion, and the gate metal layer portion of the second capacitor electrode, the gate metal layer portion of the gate electrode, and the gate metal layer portion of the pixel electrode may be formed of a same material.

At least one of the above and other features and advantages may also be realized by providing a method for manufacturing an organic light emitting diode display, the method including forming a polysilicon semiconductor layer on a substrate main body, forming a gate insulating layer covering the semiconductor layer, and forming a gate electrode and a pixel electrode on the gate insulating layer, the gate electrode and the pixel electrode each including a transparent conductive layer portion with a gate metal layer portion on the transparent conductive layer portion, and the pixel electrode including a light emitting area having the transparent conductive layer portion and a non-light emitting area having both the transparent conductive layer portion and the gate metal layer portion.

Forming the gate electrode and the pixel electrode may include sequentially forming a transparent conductive layer and a gate metal layer on the gate insulating layer, and patterning the transparent conductive layer and the gate metal layer to form the gate electrode and a pixel electrode intermediate, the pixel electrode intermediate having a multi-layer structure including a transparent conductive layer portion and a gate metal layer portion. The method may further include forming an interlayer insulating layer on the pixel electrode intermediate and the gate electrode, forming an opening in the interlayer insulating layer, the opening exposing a part of the pixel electrode intermediate, forming a data metal layer on the interlayer insulating layer, patterning the data metal layer to form a source electrode and a drain electrode, and removing a part of the gate metal layer portion of the pixel electrode intermediate that is exposed through the opening of the interlayer insulating layer.

The gate metal layer portion exposed through the opening of the interlayer insulating layer and the data metal layer may be simultaneously etched and removed by a same etching process.

The semiconductor layer may be between the substrate main body and the gate insulating layer.

The semiconductor layer may include a channel region that overlaps with the gate electrode, and source and drain regions formed on respective sides of the channel region.

Contact holes that partially expose the source region and drain region of the semiconductor layer and the non-light emitting area of the pixel electrode intermediate may be formed when forming the opening in the interlayer insulating layer.

The source electrode may be connected to the source region of the semiconductor layer, and the drain electrode may be respectively connected to the drain region of the semiconductor layer and the non-light emitting area of the pixel electrode.

The gate metal layer and the data metal layer may be formed of a same material.

The gate metal layer portion of the gate electrode, the source electrode, and the drain electrode may each be formed as a multi-layer structure that includes a metal layer formed of copper or aluminum, and a metal layer formed of molybdenum.

The method may further include forming a pixel defining layer on the source electrode and the drain electrode, the pixel defining layer having an opening exposing the light emitting area of the pixel electrode, forming an organic emission layer on the light emitting area of the pixel electrode exposed through the opening of the pixel defining layer, and forming a common electrode on the organic emission layer.

The method may further include forming a first capacitor electrode of polysilicon on a same layer as the semiconductor layer, and forming a second capacitor electrode of a same material as the gate electrode and on a same layer as the gate electrode.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
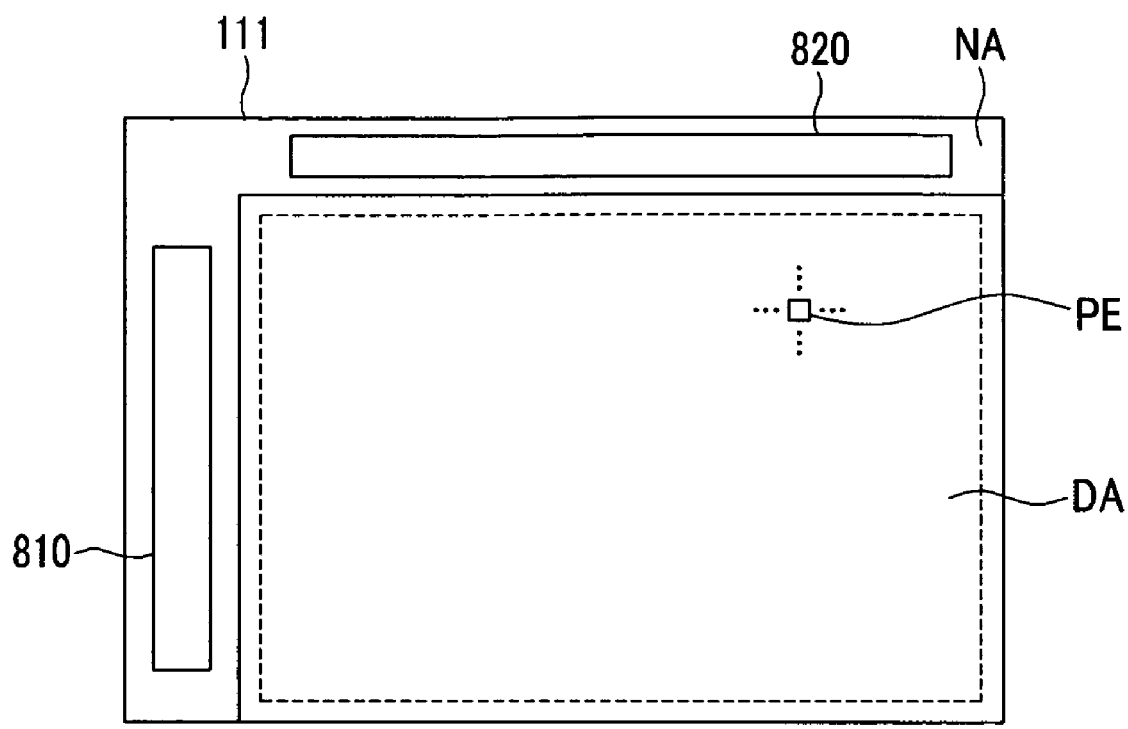
FIG. 1 illustrates a top plan view showing a structure of an organic light emitting diode display according to an example embodiment.

Korean Patent Application No. 10-2009-0110479, filed on Nov. 16, 2009, in the Korean Intellectual Property Office, and entitled: "Organic Light Emitting Diode Display And Method for Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An organic light emitting diode display 101 according to a first example embodiment will now be described with reference to FIGS. 1 to 3.

Referring to FIG. 1, the organic light emitting diode display 101 may include a substrate main body 111. The substrate main body may have a display area DA and a non-display area NA. The substrate main body 111 may be at a viewing side of the organic light emitting diode display 101, with a bottom emission structure being employed. The display area DA of the substrate main body 111 may be provided with a plurality of pixels PE to display an image. The non-display area NA may be provided with one or more driving circuits 810 and 820.

Figure 2:
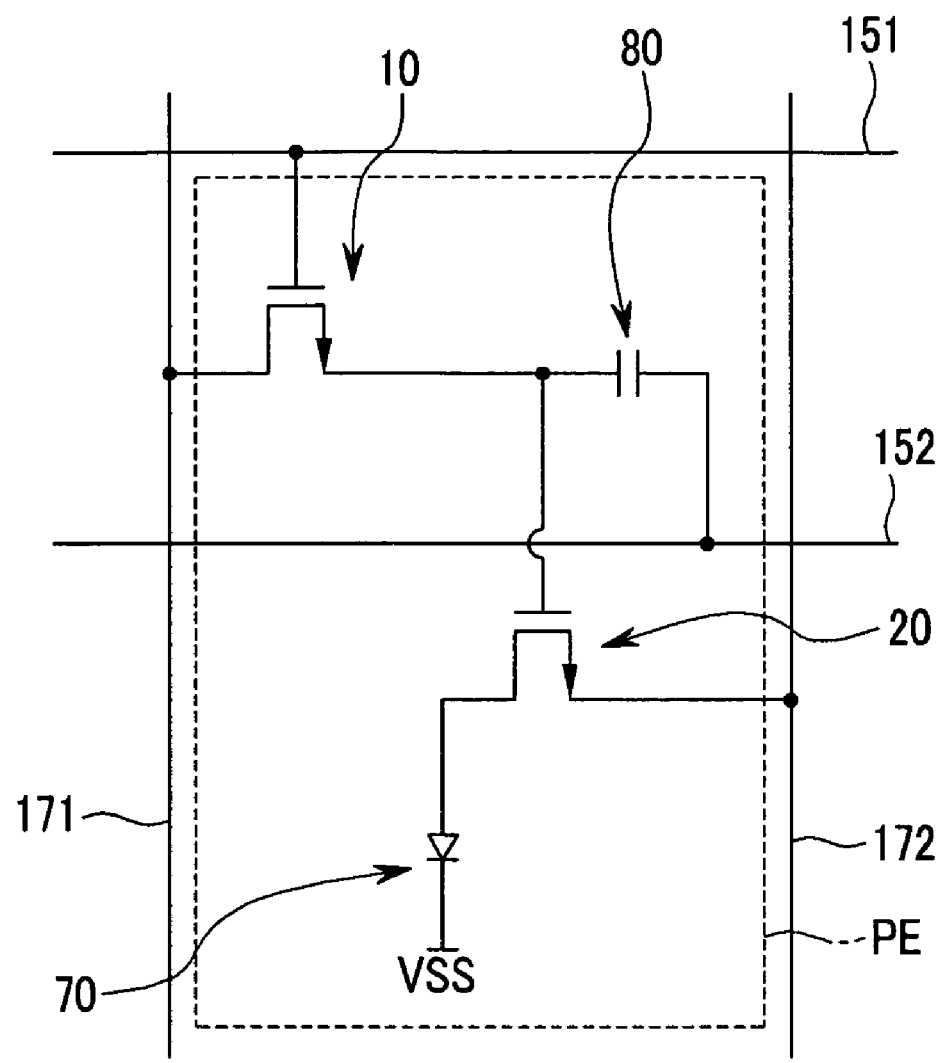
FIG. 2 illustrates a circuit diagram showing a pixel circuit of the organic light emitting diode display of FIG. 1.

Referring to FIG. 2, an example embodiment provides a two-transistor, 1-capacitor (2Tr-1Cap) structure in which one pixel PE includes an organic light emitting diode 70, two thin film transistors (TFTs) 10 and 20, and one capacitor 80. In another embodiment, one pixel PE of the organic light emitting diode display 101 may have three or more thin film transistors and two or more capacitors, and may have various structures by further including additional wires. For example, thin film transistors and capacitors may be additionally provided to form a compensation circuit.

The compensation circuit may improve the uniformity of light provided the organic light emitting diode 70 in each pixel PE to suppress a deviation in picture quality. The compensation circuit may include, e.g., two to eight thin film transistors.

Moreover, the driving circuits 810 and 820 (shown in FIG. 1) formed on the non-display area NA of the substrate main body 111 may include additional thin film transistors.

The organic light emitting diode 70 may include an anode serving as a hole injection electrode, a cathode serving as an electron injection electrode, and an organic emission layer disposed between the anode and the cathode.

In an example embodiment, one pixel PE includes a first thin film transistor 10 and a second thin film transistor 20.

The first thin film transistor 10 and the second thin film transistor 20 may each include a gate electrode, a semiconductor layer, a source electrode, and a drain electrode. One or both of the first thin film transistor 10 and the second thin film transistor 20 may include a semiconductor layer formed of polysilicon. Thus, one or both of the first thin film transistor 10 and the second thin film transistor 20 may be a polysilicon thin film transistor.

FIG. 2 depicts a gate line 151, a data line 171, a common power line 172, and a capacitor line 152. In another implementation, the capacitor line 152 may be omitted.

A source electrode of the first thin film transistor 10 may be connected to the data line 171, and a gate electrode of the first thin film transistor 10 may be connected to the gate line 151. A drain electrode of the first thin film transistor 10 may be connected to the capacitor line 152 via the capacitor 80. A node may be formed between the drain electrode of the first thin film transistor 10 and the capacitor 80, and may be connected to a gate electrode of the second thin film transistor 20. The common power line 172 may be connected to a source electrode of the second thin film transistor 20, and the anode of the organic light emitting diode 70 may be connected to a drain electrode thereof.

The first thin film transistor 10 may be used as a switching element for selecting a pixel PE to emit light. When the first thin film transistor 10 is turned on, the capacitor 80 may be charged. The amount of electric charge may be proportional to the voltage applied from the data line 171. With the first thin film transistor 10 turned off, when a signal for increasing the voltage every frame period is input to the capacitor line 152, the gate potential of the second thin film transistor 20 may rise along with an increase in the level of the voltage applied via the capacitor line 152 with respect to the potential charged in the capacitor 80. Further, the second thin film transistor 20 is turned on when the gate potential exceeds a threshold voltage. Then, the voltage applied to the common power line 172 may be applied to the organic light emitting diode 70 via the second thin film transistor 20, so that the organic light emitting diode 70 emits light.

The organic light emitting diode display 101 will now be described with respect to the lamination order of the structures of the organic light emitting diode 70, the second thin film transistor 20, and the capacitor 80 according to an example embodiment, with reference to FIG. 3.

The substrate main body 111 may be, e.g., an insulating substrate made of glass, quartz, ceramic, plastic, or the like. The substrate main body 111 may be transparent.

A buffer layer 120 may be formed on the first substrate member 111. The buffer layer 120 may be transparent. For example, the buffer layer 120 may have a single-layer structure of silicon nitride ($SiN_x$), or a dual-layer structure of silicon nitride ($SiN_x$) and silicon oxide ($SiO_2$). The buffer layer 120 may prevent penetration of unnecessary elements, such as impurity particles or moisture, and may help planarize the surface. The buffer layer 120 may be omitted depending on the type and process conditions of the substrate main body 111.

A semiconductor layer 135 and a first capacitor electrode 138 may be formed on the buffer layer 120. The semiconductor layer 135 and the first capacitor electrode 138 may be formed on the same layer. In an implementation, the semiconductor layer 135 and the first capacitor electrode 138 may be formed directly on the buffer layer 120. The semiconductor layer 135 and the first capacitor electrode 138 may both formed of a same material, e.g., a polysilicon film.

The semiconductor layer 135 may have a channel region 1355, and source and drain regions 1357 and 1356 formed on both sides of the channel region 1355. The channel region 1355 of the semiconductor layer 135 may be a polysilicon film that is not doped with an impurity, i.e., an intrinsic semiconductor. The source region 1357 and drain region 1356 of the semiconductor layer 135 may be polysilicon films doped with an impurity.

The impurity doped in the source region 1357 and drain region 1356 of the semiconductor layer 135 may be, e.g. a P-type impurity or an N-type impurity. The type of the impurity may vary according to the type of the thin film transistor 20.

A gate insulating layer 140 may be formed on the semiconductor layer 135 and the first capacitor electrode 138. The gate insulating layer 140 may be transparent. The gate insulating layer 140 may include one or more of tetraethylorthosilicate (TEOS), silicon nitride ($SiN_x$), and silicon oxide ($SiO_2$). For example, the gate insulating layer 140 may be formed as a dual layer including a silicon nitride layer having a thickness of 40 nm and a tetraethylorthosilicate layer having a thickness of 80 nm that are sequentially stacked therein.

A gate electrode 155, a pixel electrode 710, and a second capacitor electrode 158 may be formed on the gate insulating layer 140. The gate electrode 155, the pixel electrode 710, and the second capacitor electrode 158 may each be positioned on the same layer. The second capacitor electrode 158 may be branched from the capacitor line 152 (shown in FIG. 2). In another implementation, a part of the capacitor line 152 may be used as the second capacitor electrode 158.

The gate electrode 155 may be formed on the semiconductor layer 135 so as to overlap with the channel region 1355 of the semiconductor layer 135. The gate electrode 155 may be used as an implantation mask to prevent the channel region 1355 from being doped with an impurity during doping of the source region 1357 and drain region 1356 of the semiconductor layer 135.

The second capacitor electrode 158 may be formed on the first capacitor electrode 138. The capacitor 80 may include the second capacitor electrode 158 formed on the first capacitor electrode 138, with the gate insulating layer 140 interposed therebetween.

The gate electrode 155, the pixel electrode 710, and the second capacitor electrode 158 may each be formed to have a same multi-layer structure, which may include a transparent conductive layer portion (1551, 711, and 1581) and a gate metal layer portion (1552, 712, and 1582) that are sequentially stacked on the gate insulating layer 140.

The transparent conductive layer portion (1551, 711, and 1581) may be made of a transparent conductive material, such as indium tin oxide (ITO), indium zinc oxide (IZO), zinc oxide (ZnO), or indium oxide ($In_2O_3$). In an implementation, the transparent conductive layer portion (1551, 711, and 1581) may be formed directly on the gate insulating layer 140.

The gate metal layer portion (1552, 712, and 1582) may be formed from a metal having low resistivity. The gate metal layer portion (1552, 712, and 1582) may be formed as a multi-layer. The multi-layer may include, e.g., a metal layer formed of copper (Cu) or aluminum (Al), and a metal layer formed of molybdenum (Mo). For example, the gate metal layer may be formed as a triple layer of Mo/Al/Mo or a triple layer of Mo/Cu/Mo.

The pixel electrode 710 may include a light emitting area formed only of the transparent conductive layer portion 711, i.e., a transparent area, and a non-light emitting area having the transparent conductive layer portion 711 and the gate metal layer portion 712 stacked therein, i.e., an opaque area. The light emitting area of the pixel electrode 710 may transmit light from the organic emission layer.

An interlayer insulating layer 160 may be formed on the pixel electrode 710, the gate electrode 155, and the second capacitor electrode 158. The interlayer insulating layer 160 may be formed of an organic film. In another implementation, the interlayer insulating layer 160 may be formed of an inorganic film, e.g., a same material as used to form the gate insulating layer 140.

The interlayer insulating layer 160 may have an opening 1605 exposing a part of the pixel electrode 710. The opening 1605 of the interlayer insulating layer 160 may expose part or all of the light emitting area of the pixel electrode 710. The transparent conductive layer portion 711 of the pixel electrode 710 may be exposed through the opening 1605 of the interlayer insulating layer 160. In an implementation, as shown in FIG. 3, the gate metal layer portion 712 of the pixel electrode 710 may be formed with an undercut shape around the opening 1605 of the interlayer insulating layer 160.

The interlayer insulating layer 160 may also have contact holes 1607, 1606, and 1601 that partially expose the source region 1357 and drain region 1356 of the semiconductor layer 135, and the non-light emitting area (i.e., the gate metal layer portion 712), respectively, of the pixel electrode 710. A source electrode 177 and a drain electrode 176 may be formed on the interlayer insulating layer 160. The source electrode 177 may be connected to the source region 1357 of the semiconductor layer 135 via the contact hole 1607, and the drain electrode 176 may be respectively connected to, i.e., connected to each of, the drain region 1356 and the non-light emitting area of the pixel electrode 710. Thus, the drain electrode 176 may be connected to the gate metal layer portion 712 of the pixel electrode 710.

The source electrode 177 and the drain electrode 176 may each be made of the same material as the gate metal layer 1552 of the gate electrode 155. For example, the source electrode 177 and the drain electrode 176 may be formed as a multi-layer including a metal layer formed of any one of copper (Cu) and aluminum (Al), and a metal layer formed of molybdenum (Mo).

A pixel defining layer 190 may be formed on the source electrode 177 and the drain electrode 176. The pixel defining layer 190 may be formed of, e.g., an organic material. The pixel defining layer 190 may have an opening 1905 exposing the light emitting area of the pixel electrode 710. The opening 1905 of the pixel defining layer 190 may be the same size or smaller than the corresponding opening 1605 of the interlayer insulating layer 160.

An organic emission layer 720 may be formed on the light emitting area, i.e., on the transparent conductive layer 711, of the pixel electrode 710, in the opening of the pixel defining layer 190.

The organic emission layer 720 may include an emission layer. In an implementation, the organic emission layer 720 may be formed as a multi-layer including the emission layer and one or more of a hole injection layer (HIL), a hole transport layer (HTL), an electron transport layer (ETL), and an electron injection layer (EIL). For example, the organic emission layer 720 may include all of the aforementioned layers the pixel electrode 710 may serve as an anode, the hole injection layer is disposed on the pixel electrode 710, and the hole transport layer, the emission layer, the electron transport layer, and the electron injection layer may be sequentially stacked thereon. In other implementations, the organic emission layer 720 may further include other layers. In an implementation, layers other than the emission layer may be formed on the pixel defining layer 190 as well as on the pixel electrode 710.

A common electrode 730 may be formed on the organic emission layer 720. The common electrode 730 may be made of, e.g., a metal that effectively reflects light and has an excellent low resistance characteristic. For example, the common electrode 730 may be made of one or more metals such as magnesium (Mg), silver (Ag), gold (Au), calcium (Ca), lithium (Li), chromium (Cr), aluminum (Al), an alloy of such metals, etc.

Light generated from the organic emission layer 720 may pass through the transparent conductive layer portion 711 of the pixel electrode 710 so as to be emitted to the outside to display an image. Thus, the organic light emitting diode display 101 may have a bottom emission structure. In another implementation, the substrate main body 111 may be formed as a metallic substrate made of stainless steel or the like, with the common electrode 730 being made of a transparent conductive material and a top emission structure being employed.

An encapsulation member 210 may be disposed on the common electrode 730. The encapsulation member 210 may be bonded and sealed to the substrate main body 111 to protect the organic light emitting diode 70 and the thin film transistor 20. The encapsulation member 210 may be bonded and sealed to the substrate main body 111 by means of a sealant (not shown) disposed along the edges of the encapsulation member 210. The encapsulation member 210 may be formed as a transparent insulating substrate made of, e.g., glass, quartz, ceramic, plastic, or the like. In another implementation, a metal cap or an encapsulating thin layer or multi-layer may be used as the encapsulation member 210.

As described above, the organic light emitting diode display 101 according to an example embodiment may have a relatively simple structure. The pixel electrode 710 may be formed of the same material, and on the same layer, as the gate electrode 155 of the thin film transistor 20. Thus, the pixel electrode 710 need not be formed of a different material on a different layer, simplifying the entire structure of the organic light emitting diode display 101 and simplifying the manufacturing process. Moreover, the organic light emitting diode display 101 may be easily implemented with a bottom emission structure while forming the pixel electrode 710 on the same layer as the gate electrode 155.

A method for manufacturing the organic light emitting diode display 101 according to an example embodiment will now be described with reference to FIGS. 4 to 8.

Figure 4:
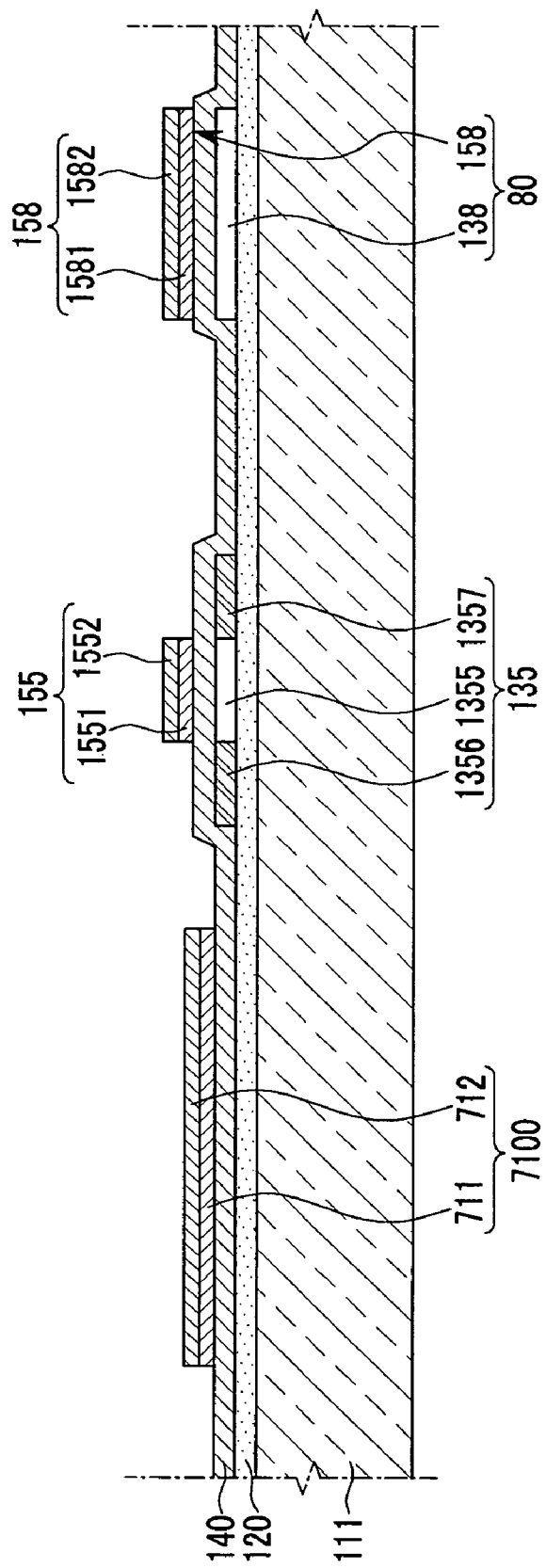
FIGS. 4 to 8 illustrate cross-sectional views of stages in a method for manufacturing the organic light emitting diode display of FIG. 3.

Referring to FIG. 4, the buffer layer 120 is formed on a substrate main body 111. The buffer layer 120 may be formed by depositing an inorganic insulating material such as silicon nitride ($SiN_x$) or silicon oxide ($SiO_2$) on the substrate main body 111 by a deposition method such as plasma enhanced chemical vapor deposition (PECVD).

Next, a polysilicon film may be formed on the buffer layer 120. The polysilicon film may be formed by forming an amorphous silicon film and then crystallizing the amorphous silicon film. The amorphous silicon film may be formed by a method such as PECVD. Various methods may be used to crystallize the amorphous silicon film, e.g., the amorphous silicon film may be crystallized using heat, a laser, Joule heat, an electrical field, a catalytic metal, or the like. Furthermore, a dehydrogenation process for removing hydrogen atoms from the amorphous silicon film may be carried out prior to crystallization.

Next, the amorphous silicon film may be patterned by photolithography to form a semiconductor layer 135 and a first capacitor electrode 138.

Next, a gate insulating layer 140 may be formed on the semiconductor layer 135 and the first capacitor electrode 138. The gate insulating layer 140 may include one or more inorganic films, e.g., a silicon nitride layer having a thickness of 40 nm with a tetraethylorthosilicate (TEOS) layer having a thickness of 80 nm formed thereon. The inorganic films may be formed by a method such as PECVD.

Next, a transparent conductive layer and a gate metal layer may be sequentially formed on the gate insulating layer 140. The transparent conductive layer may be formed of, e.g., indium tin oxide (ITO), indium zinc oxide (IZO), zinc oxide (ZnO), or indium oxide ($In_2O_3$). In an implementation, the gate metal layer may be formed as a multi-layer including a metal layer formed of any one of copper (Cu) and aluminum (Al), and a metal layer formed of molybdenum (Mo). For example, the gate metal layer may be formed as a triple layer of Mo/Al/Mo or a triple layer of Mo/Cu/Mo.

Next, the transparent conductive layer and the gate metal layer may be patterned by photolithography to form the gate electrode 155, the second capacitor electrode 158, and the pixel electrode intermediate 7100. The gate electrode 155, the second capacitor electrode 155, and the pixel electrode intermediate 7100 may each be formed in a multi-layer structure, the multi-layer structure including the transparent conductive layer portion (1551, 1581, and 711) and the gate metal layer portion (1552, 1582, and 712) that are sequentially stacked.

Next, the semiconductor layer 135 may be doped with an impurity, which may define the source and drain regions 1357 and 1356 on both sides of the channel region 1355. The channel region 1355 may be an intrinsic semiconductor that is not doped with an impurity, and the source region 1357 and the drain region 1356 may be impurity semiconductors that are doped with an impurity. The gate electrode 155 may block dopant implantation to prevent the channel region 1355 from being doped with an impurity when doping the source region 1357 and the drain region 1356 with the impurity.

Figure 5:
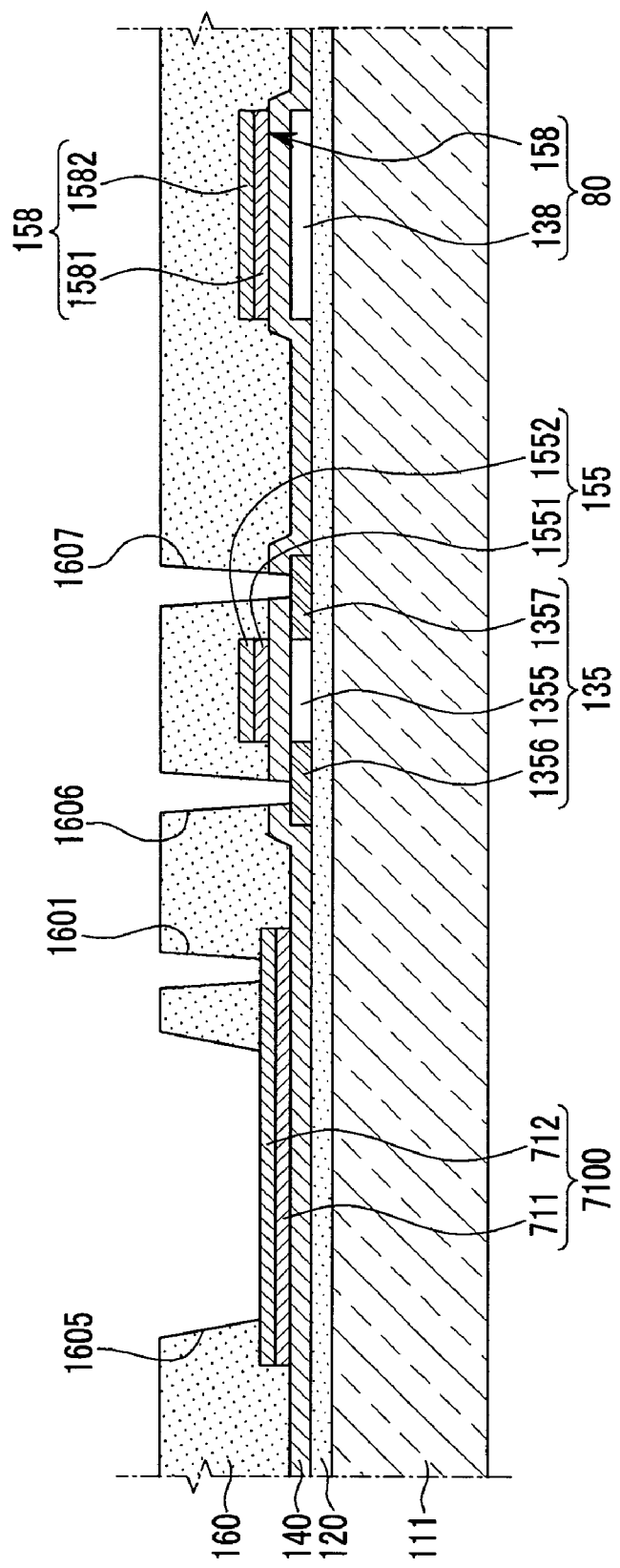

Next, as shown in FIG. 5, the interlayer insulating layer 160 may be formed on the pixel electrode intermediate 7100, the gate electrode 155, and the second capacitor electrode 158. An organic film or an inorganic film may be used as the interlayer insulating layer 160.

Next, the opening 1605, and the contact holes 1601, 1606, and 1607 may be formed on the interlayer insulating layer 160 by photolithography. The opening 1605 of the interlayer insulating layer 160 may expose a part of the pixel electrode intermediate 7100. The contact holes of the interlayer insulating layer 160 may include the pixel contact hole 1601 exposing another part of the pixel electrode intermediate 7100, and the source contact hole 1607 and the drain contact hole 1606 exposing the source region 1357 and drain region 1356 of the semiconductor layer 135. The source contact hole 1607 and the drain contact hole 1606 may be formed by removing the gate insulating layer 140 and the interlayer insulating layer 160.

Figure 6:
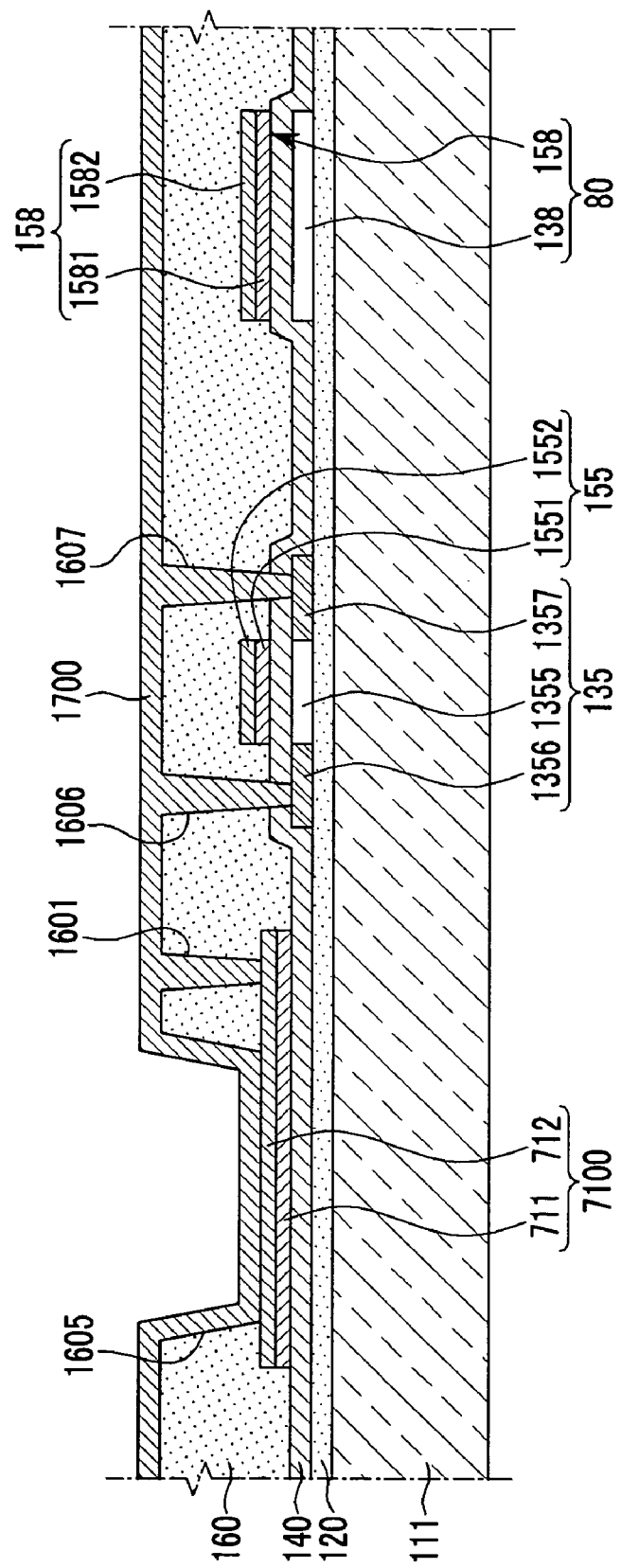

Next, as shown in FIG. 6, a data metal layer 1700 may be formed on the interlayer insulating layer 160. The data metal layer 1700 may be formed as a multi-layer including a metal layer formed of any one of copper (Cu) and aluminum (Al), and a metal layer formed of molybdenum (Mo) in the same manner as the gate metal layer portion (1552, 1582, and 712), i.e., a triple layer of Mo/Al/Mo or a triple layer of Mo/Cu/Mo. The data metal layer 1700 may make contact with the gate metal layer 712 of the pixel electrode intermediate 7100 via the pixel contact hole 1601 of the interlayer insulating layer 160. The data metal layer 1700 may also be on the pixel electrode intermediate 7100 in the opening 1605. The data metal layer 1700 may also make contact with the source region 1357 and drain region 1356 of the semiconductor layer 135 via the source contact hole 1607 and drain contact hole 1606, respectively.

Figure 7:
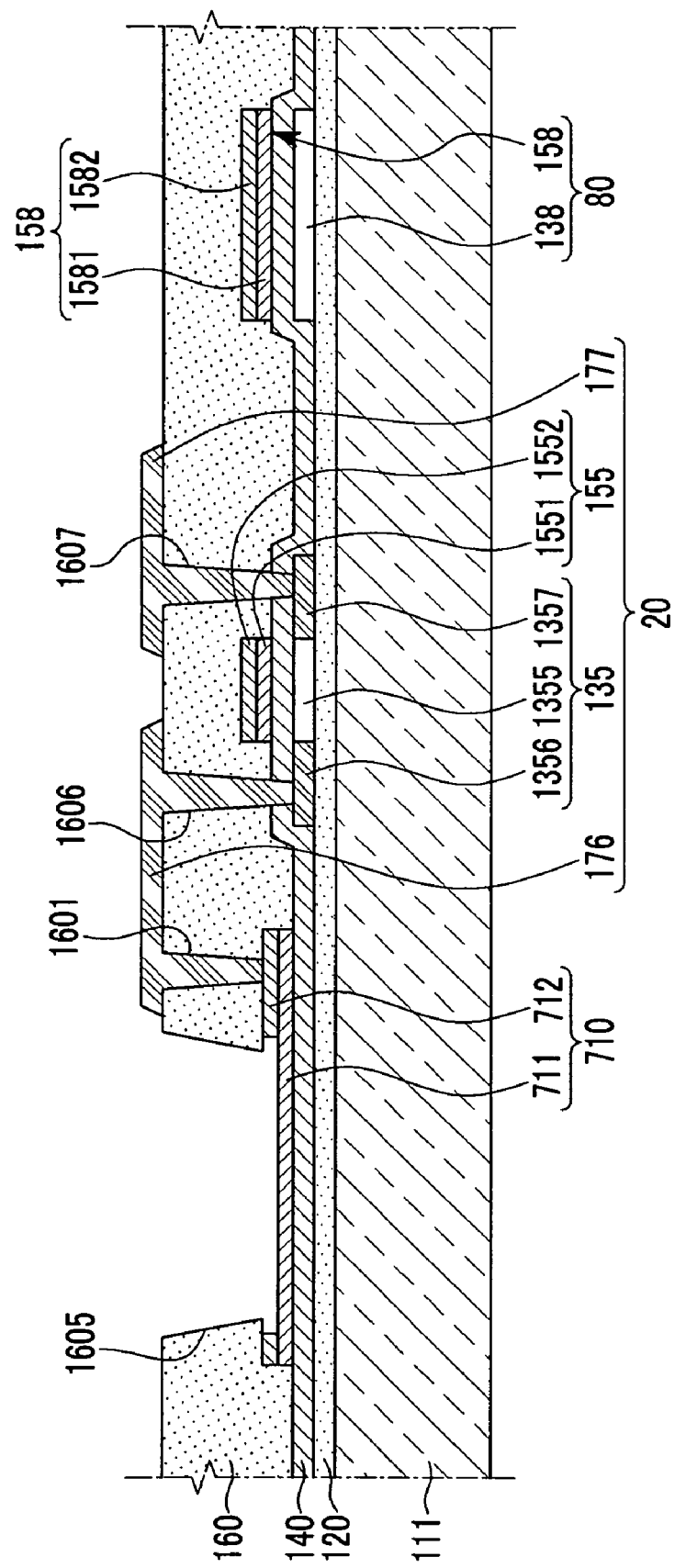

Next, as shown in FIG. 7, the data metal layer 1700 may be patterned by photolithography to form the source electrode 177 and the drain electrode 176. The gate metal layer portion 712 of the pixel electrode intermediate 7100 exposed through the opening 1605 of the interlayer insulating layer 160 may be removed to form the pixel electrode 710. The pixel electrode 710 may include the light emitting area (which may be formed only of the transparent conductive layer portion 711) and the non-light emitting area (which may be formed of the transparent conductive layer portion 711 and the gate metal layer portion 712).

In an implementation, the data metal layer 1700 and the gate metal layer portion 712 may be formed of the material. Thus, the data metal layer 1700 and the gate metal layer portion 712, which may be consecutively formed in the opening 1605 of the interlayer insulating layer 160 so as to be in contact with each other, may be simultaneously removed by a single etching process using the same etching solution. In this process, the transparent conductive layer portion 711 positioned under the gate metal layer portion 712 may remain, having a different etching selection ratio from the metal layers.

The pixel electrode 710 may be formed by forming the source electrode 177 and the drain electrode 176 by a single etching process, and removing the gate metal layer portion 712 in the opening 1605 of the interlayer insulating layer 160. Thus, the entire manufacturing process of the organic light emitting diode display 101 may be simplified.

In an implementation, the gate metal layer portion 712 remaining in the non-light emitting area may be undercut around the opening 1605 of the interlayer insulating layer 160. In another implementation, the gate metal layer portion 712 may not be undercut according to the etching method.

Figure 8:
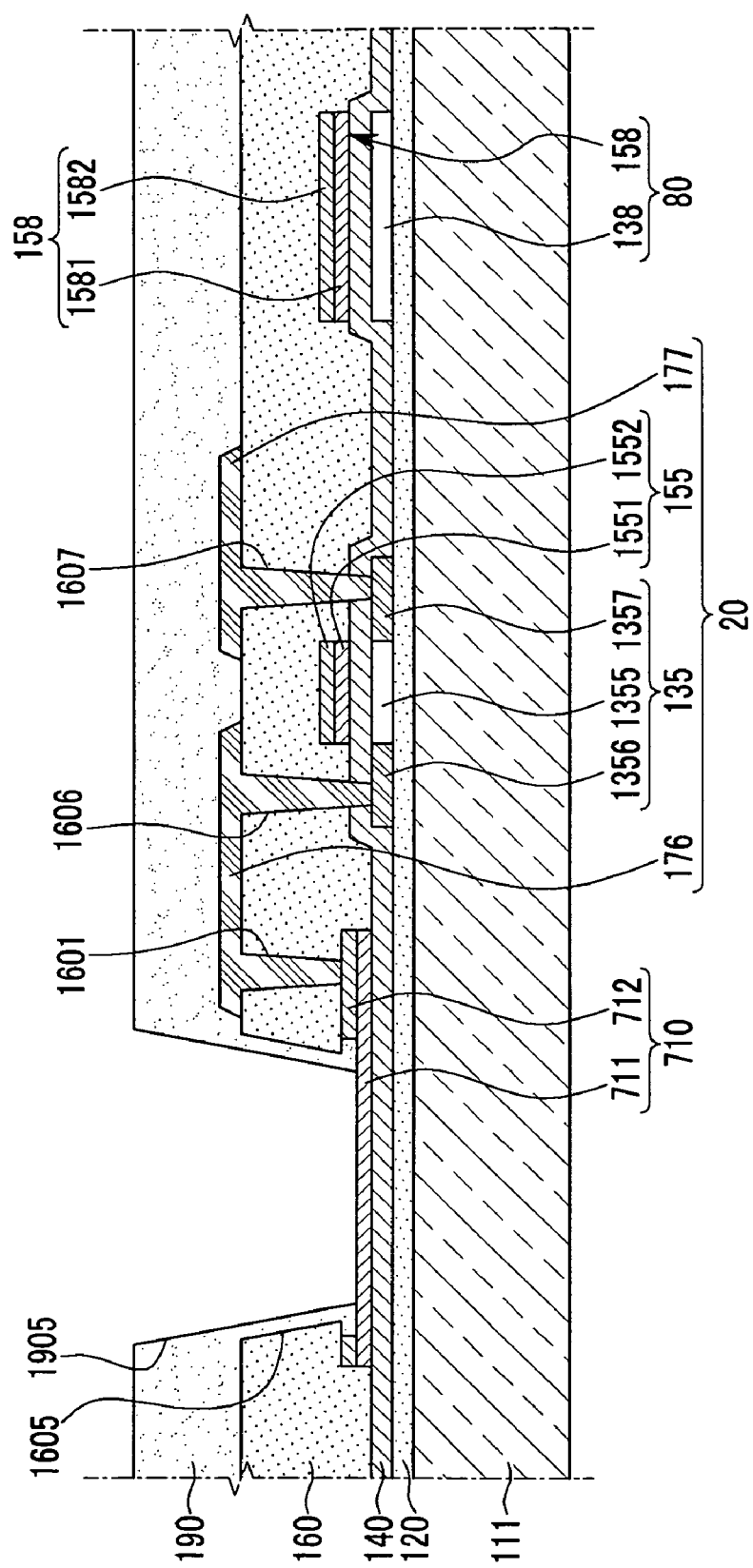

Next, as shown in FIG. 8, the pixel defining layer 190 may be formed on the source electrode 177 and the drain electrode 176. The pixel defining layer 190 may have the opening 1905 exposing the light emitting area, i.e., exposing the transparent conductive layer portion 711, of the pixel electrode 710. The opening 1905 of the pixel defining layer 190 may be the same size or smaller than the opening of the interlayer insulating layer. The pixel defining layer 190 may be formed of, e.g., an organic films.

Figure 3:
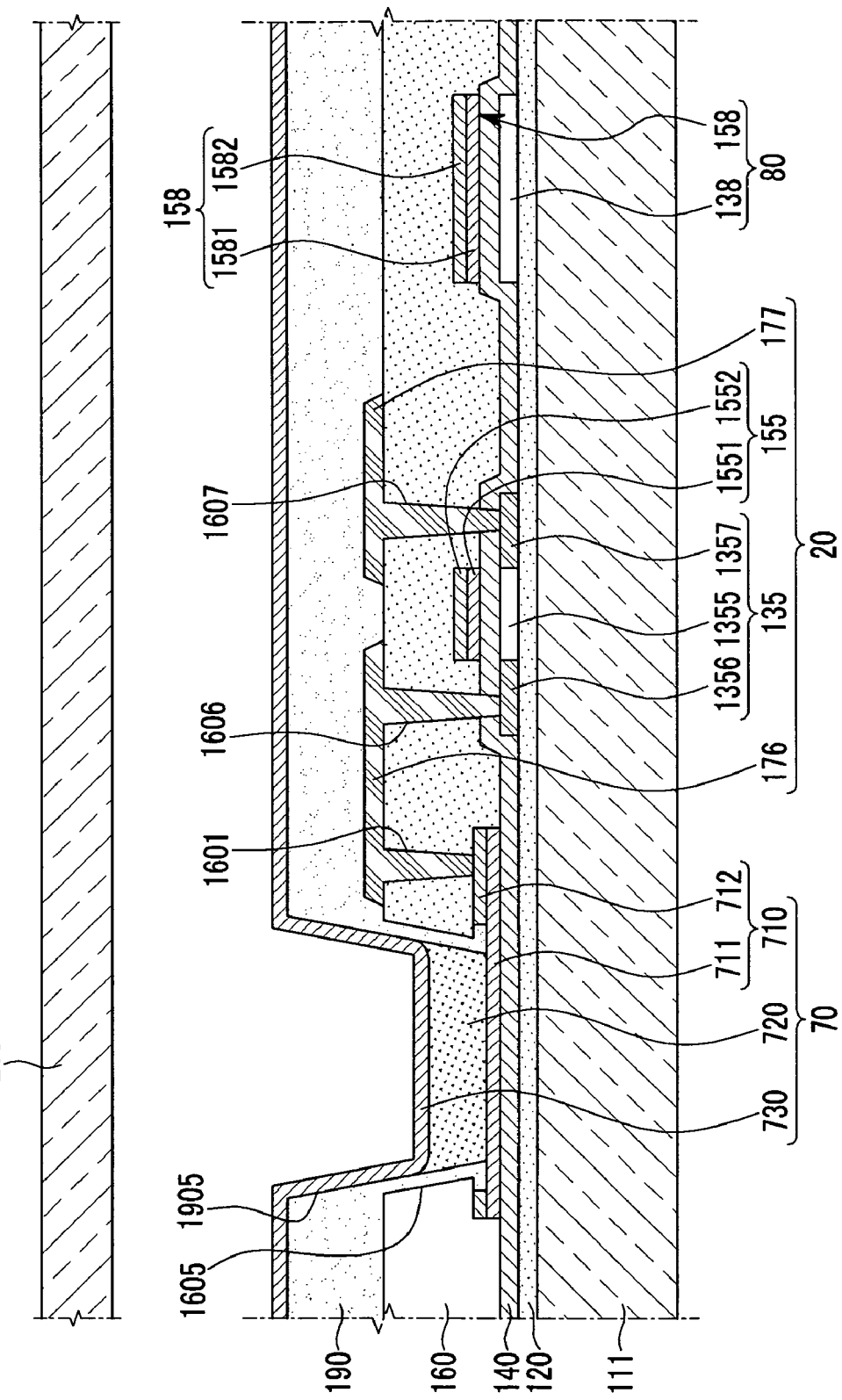
FIG. 3 illustrates an enlarged cross-sectional view partially showing the organic light emitting diode display of FIG. 1.

Next, as shown in FIG. 3, the organic emission layer 720 may be formed on the pixel electrode 710 exposed through the opening 1905 of the pixel defining layer 190. Then, the common electrode 730 may be formed on the organic light emitting layer 720 to thus complete the organic light emitting diode 70.

As described above, the manufacturing process of the organic light emitting diode display 101 according to an example embodiment may be simple. A gate line including the pixel electrode 710, the gate electrode 155, and the second capacitor electrode 158 may be formed using one mask. Moreover, the organic light emitting diode display 101 having a bottom emission structure may be easily manufactured while forming the pixel electrode 710 and the gate electrode 155 by a process using one mask. Thus, both the structure of the organic light emitting diode display and the manufacturing process may be simplified. This may become particularly important as demand for a suitable large-area thin film process increases.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode display, comprising:
   a substrate main body;
   a polysilicon semiconductor layer on the substrate main body;
   a gate insulating layer covering the semiconductor layer; and
   a gate electrode and a pixel electrode on the gate insulating layer, the gate electrode and the pixel electrode each including a transparent conductive layer portion with a gate metal layer portion on the transparent conductive layer portion, and the pixel electrode including a light emitting area having the transparent conductive layer portion and a non-light emitting area having both the transparent conductive layer portion and the gate metal layer portion.

2. The organic light emitting diode display as claimed in claim 1, wherein:
   the gate electrode is on the semiconductor layer, the transparent conductive layer portion of the gate electrode being between the gate metal layer portion of the gate electrode and the semiconductor layer, and the semiconductor layer includes a channel region, the channel region overlapping with the gate electrode, and source and drain regions on respective sides of the channel region.

3. The organic light emitting diode display as claimed in claim 1, further comprising:

an interlayer insulating layer on the gate electrode and the pixel electrode, the interlayer insulating layer having an opening that at least partially exposes the light emitting area of the pixel electrode; and a source electrode and a drain electrode on the interlayer insulating layer.

4. The organic light emitting diode display as claimed in claim 3, wherein:

the source electrode is connected to the source region of the semiconductor layer, and the drain electrode is respectively connected to the drain region of the semiconductor layer and the non-light emitting area of the pixel electrode, the drain electrode contacting the gate metal layer portion of the pixel electrode.

5. The organic light emitting diode display as claimed in claim 3, wherein the source electrode, the drain electrode, and the gate metal layer portion of the gate electrode are formed of a same material.

6. The organic light emitting diode display as claimed in claim 5, further comprising a second capacitor electrode having a gate metal layer portion, wherein the source electrode, the drain electrode, the gate metal layer portion of the second capacitor electrode, and the gate metal layer portion of the gate electrode are formed of the same material.

7. The organic light emitting diode display as claimed in claim 3, wherein the source electrode, the drain electrode, and the gate metal layer portion of the gate electrode are each a multi-layer structure that includes:

a metal layer of copper or aluminum, and a metal layer of molybdenum.

8. The organic light emitting diode display as claimed in claim 1, further comprising:

a first capacitor electrode, the first capacitor electrode having a polysilicon layer on a same layer as the polysilicon semiconductor layer; and a second capacitor electrode on the first capacitor electrode, the second capacitor electrode being on a same layer as the gate electrode.

9. The organic light emitting diode display as claimed in claim 8, wherein:

the second capacitor electrode has a gate metal layer portion, and the gate metal layer portion of the second capacitor electrode, the gate metal layer portion of the gate electrode, and the gate metal layer portion of the pixel electrode are formed of a same material.

10. A method for manufacturing an organic light emitting diode display, the method comprising:

forming a polysilicon semiconductor layer on a substrate main body;

forming a gate insulating layer covering the semiconductor layer; and forming a gate electrode and a pixel electrode on the gate insulating layer, the gate electrode and the pixel electrode each including a transparent conductive layer portion with a gate metal layer portion on the transparent conductive layer portion, and the pixel electrode including a light emitting area having the transparent conductive layer portion and a non-light emitting area having both the transparent conductive layer portion and the gate metal layer portion.

11. The method as claimed in claim 10, wherein forming the gate electrode and the pixel electrode includes:

sequentially forming a transparent conductive layer and a gate metal layer on the gate insulating layer; and patterning the transparent conductive layer and the gate metal layer to form the gate electrode and a pixel electrode intermediate, the pixel electrode intermediate having a multi-layer structure including a transparent conductive layer portion and a gate metal layer portion, the method further comprising:

forming an interlayer insulating layer on the pixel electrode intermediate and the gate electrode;

forming an opening in the interlayer insulating layer, the opening exposing a part of the pixel electrode intermediate;

forming a data metal layer on the interlayer insulating layer;

patterning the data metal layer to form a source electrode and a drain electrode; and removing a part of the gate metal layer portion of the pixel electrode intermediate that is exposed through the opening of the interlayer insulating layer.

12. The method as claimed in claim 11, wherein the gate metal layer portion exposed through the opening of the interlayer insulating layer and the data metal layer are simultaneously etched and removed by a same etching process.

13. The method as claimed in claim 12, wherein the semiconductor layer is between the substrate main body and the gate insulating layer.

14. The method as claimed in claim 13, wherein the semiconductor layer includes a channel region that overlaps with the gate electrode, and source and drain regions formed on respective sides of the channel region.

15. The method of claim 14, wherein contact holes that partially expose the source region and drain region of the semiconductor layer and the non-light emitting area of the pixel electrode intermediate are formed when forming the opening in the interlayer insulating layer.

16. The method as claimed in claim 13, wherein the source electrode is connected to the source region of the semiconductor layer, and the drain electrode is respectively connected to the drain region of the semiconductor layer and the non-light emitting area of the pixel electrode.

17. The method as claimed in claim 12, wherein the gate metal layer and the data metal layer are formed of a same material.

18. The method as claimed in claim 12, wherein the gate metal layer portion of the gate electrode, the source electrode, and the drain electrode are each formed as a multi-layer structure that includes:

a metal layer formed of copper or aluminum, and a metal layer formed of molybdenum.

19. The method as claimed in claim 11, further comprising:

forming a pixel defining layer on the source electrode and the drain electrode, the pixel defining layer having an opening exposing the light emitting area of the pixel electrode;

forming an organic emission layer on the light emitting area of the pixel electrode exposed through the opening of the pixel defining layer; and forming a common electrode on the organic emission layer.

20. The method as claimed in claim 10, further comprising:

forming a first capacitor electrode of polysilicon on a same layer as the semiconductor layer; and forming a second capacitor electrode of a same material as the gate electrode and on a same layer as the gate electrode.

* * * * *